(12) United States Patent
Wang

(10) Patent No.: US 11,615,296 B2
(45) Date of Patent: Mar. 28, 2023

(54) METHODS, ELECTRONIC DEVICES, AND COMPUTER STORAGE MEDIA FOR TESTING DEPTH LEARNING CHIP

(71) Applicant: BEIJING BAIDU NETCOM SCIENCE AND TECHNOLOGY CO., LTD., Beijing (CN)

(72) Inventor: Yong Wang, Beijing (CN)

(73) Assignee: KUNLUNXIN TECHNOLOGY (BEIJING) COMPANY LIMITED, Beijing (CN)

( * ) Notice: Subject to any disclaimer, the term of this patent is extended or adjusted under 35 U.S.C. 154(b) by 460 days.

(21) Appl. No.: 16/871,473

(22) Filed: May 11, 2020

(65) Prior Publication Data

US 2020/0410332 A1    Dec. 31, 2020

(30) Foreign Application Priority Data

Jun. 26, 2019   (CN) .......................... 201910559182.9

(51) Int. Cl.
   *G06N 3/04*     (2023.01)
   *G06N 3/063*    (2023.01)
   *G06N 3/08*     (2023.01)

(52) U.S. Cl.
   CPC .............. *G06N 3/063* (2013.01); *G06N 3/04* (2013.01); *G06N 3/08* (2013.01)

(58) Field of Classification Search
   CPC ............. G06N 3/063; G06N 3/04; G06N 3/08
   See application file for complete search history.

(56) References Cited

U.S. PATENT DOCUMENTS 6,067,633 A      5/2000   Robbins et al.
2007/0260823 A1  11/2007  Dickinson et al.
(Continued)

FOREIGN PATENT DOCUMENTS

CN    109684087 A    4/2019
JP    H11328133 A    11/1999
(Continued)

OTHER PUBLICATIONS

Morcel, Raghid, Mazen Ezzeddine, and Haitham Akkary. "Fpga-based accelerator for deep convolutional neural networks for the spark environment." In 2016 IEEE International Conference on SmartCloud (SmartCloud), pp. 126-133. IEEE, 2016. (Year: 2016).*
(Continued)

*Primary Examiner* — Casey R. Garner
(74) *Attorney, Agent, or Firm* — Lippes Mathias LLP

(57) ABSTRACT

Embodiments of the present disclosure provide a method and an apparatus for testing a depth learning chip, an electronic device, and a computer-readable storage medium. The method includes: testing a plurality of logic units in the depth learning chip. The plurality of logic units are configured to perform at least one of an inference operation and a training operation for depth learning. The method further include: obtaining one or more error units that do not pass the testing from the plurality of logic units. In addition, the method further includes: in response to a ratio of a number of the one or more error units to a total number of the plurality of logic units being lower than or equal to a predetermined ratio, determining the depth learning chip as a qualified chip.

17 Claims, 3 Drawing Sheets

(56) References Cited

U.S. PATENT DOCUMENTS

| | | |
|---|---|---|
| 2013/0159799 A1 | 6/2013 | Brown et al. |
| 2014/0298124 A1 | 10/2014 | Douskey et al. |
| 2018/0121274 A1 | 5/2018 | Speier et al. |
| 2018/0181474 A1 | 6/2018 | DeHaemer et al. |
| 2019/0042529 A1 | 2/2019 | Nurvitadhi |
| 2019/0303741 A1 | 10/2019 | Appuswamy et al. |
| 2019/0392297 A1* | 12/2019 | Lau .................. G06F 17/16 |

FOREIGN PATENT DOCUMENTS

| | | | |
|---|---|---|---|
| JP | 2005309867 A | 11/2005 | |
| JP | 2011215853 A | 10/2011 | |
| JP | 2019003588 A | 1/2019 | |
| KR | 101820221 B1 | 2/2018 | |
| WO | 2018193353 A1 | 10/2018 | |

OTHER PUBLICATIONS

Extended European Search Report for EP Application No. 20165653. 5, dated Nov. 10, 2020, 9 pages.
Office Action for Korean Application No. 2020-081259014, dated Nov. 23, 2020, 11 pages.
"Artificial Intelligence Chip Start Up Recent Development", Institute of Korea Network Experts Association, 29 pages.
Office Action for Japanese Application No. 2020-108976, dated Jul. 27, 2021, 4 pages.

* cited by examiner

METHODS, ELECTRONIC DEVICES, AND COMPUTER STORAGE MEDIA FOR TESTING DEPTH LEARNING CHIP

CROSS-REFERENCE TO RELATED APPLICATION

This application claims a priority to and benefits of Chinese Patent Application No. 201910559182.9 filed with the China National Intellectual Property Administration on Jun. 26, 2019, the entire content of which is incorporated herein by reference.

FIELD

Embodiments of the present disclosure relate to a field of chip test, and more particularly to a method, an electronic device, and a computer-readable storage medium for testing a depth learning chip.

BACKGROUND

An availability (or "yield") of chips usually refers to a ratio of chips that pass a testing to total chips, in a life period of a wafer, batch or product. There may be dust or other particles that fall randomly in a production environment, and there may be a disadvantage during designing an integrated circuit, thereby causing a low availability of chips. A current depth learning chip (or "artificial intelligent chip") usually includes a plurality of inference logic units and a plurality of training logic units. When there is a flaw at any logic unit in the depth learning chip, the depth learning chip is marked as failing to pass the testing. A cost of the chip is linearly related to the availability of the chip. The lower the availability, the higher the cost is. Therefore, the availability of the chip has a great influence on the cost of the chip, and it is important to improve the availability of the chip for improving a competitiveness of the chip.

SUMMARY

In a first aspect of the present disclosure, there is provided a method for testing a depth learning chip. The method includes: testing a plurality of logic units in the depth learning chip. The plurality of logic units are configured to perform at least one of an inference operation and a training operation for depth learning. The method further include: obtaining one or more error units that do not pass the testing from the plurality of logic units. In addition, the method further includes: in response to a ratio of a number of the one or more error units to a total number of the plurality of logic units being lower than or equal to a predetermined ratio, determining the depth learning chip as a qualified chip.

In a second aspect of the present disclosure, there is provided a device. The device includes: one or more processors and a storage device. The storage device is configured to store one or more programs. When the one or more programs are executed by the one or more processors, the one or more processors are caused to implement the method according to the first aspect of the present disclosure.

In a third aspect of the present disclosure, there is a computer-readable storage medium having computer programs stored thereon. When the computer programs are executed by a processor, the method according to the first aspect of the present disclosure is implemented.

It should be understood that, descriptions in Summary of the present disclosure are not intended to limit an essential or important feature in embodiments of the present disclosure, and are also not construed to limit the scope of the present disclosure. Other features of the present disclosure will be easily understood by following descriptions.

BRIEF DESCRIPTION OF THE DRAWINGS

The above and other features, advantages and aspects of respective embodiments of the present disclosure will become more apparent with reference to accompanying drawings and following detailed illustrations. In the accompanying drawings, the same or similar numeral references represent the same or similar elements, in which.

DETAILED DESCRIPTION

Figure 1:
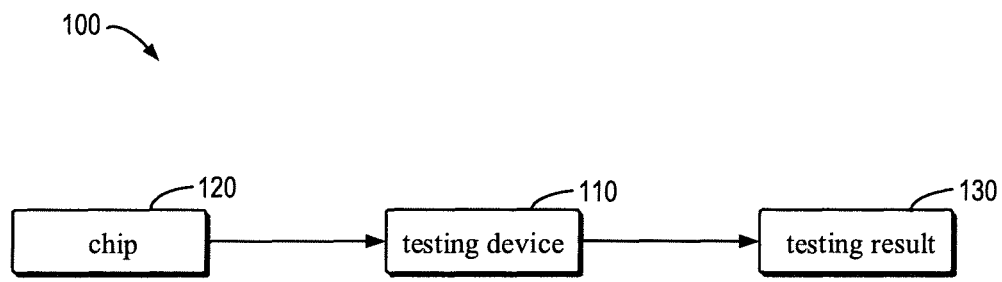
FIG. 1 is a block diagram illustrating an exemplary scene 100 where a plurality of embodiments of the present disclosure may be implemented.

Description will be made in detail below to embodiments of the present disclosure with reference to accompanying drawings. Some embodiments of the present disclosure are illustrated in the accompanying drawings. It should be understood that, embodiments of the present disclosure may be implemented in various ways, but not be construed as a limitation of the embodiments herein. On the contrary, those embodiments provided are merely for a more thorough and complete understanding of the present disclosure. It should be understood that, the accompanying drawings and embodiments of the present disclosure are merely for exemplary purposes, but is not meant to limit the protection scope of the present disclosure.

In the description of embodiments of the present disclosure, the terms "includes" and its equivalents like should be understood as an open "include", that is, "include but not limited to". The terms "based on" should be understood as "based at least in part". The terms "an embodiment" or "the embodiment" should be understood as "at least one embodiment". The terms "first", "second" and the like may represent different or same objects. Other explicit and implicit definitions may also be included below.

As mentioned above, it needs urgently a method for testing a depth learning chip to test the depth learning chip quickly, efficiently and at low cost, thereby improving an availability of the chip. A conventional method for testing a depth learning chip usually performs testing on the depth learning chip. Once the depth learning chip fails to pass the testing, it is considered that the depth learning chip is unusable. Even if one logic unit in the depth learning chip is error and the other logic units in the depth learning chip are intact, the depth learning chip is still regarded as a fault chip. Therefore, with the conventional method for testing the depth learning chip, it causes a great waste of the depth learning chip.

According to embodiments of the present disclosure, there is provided a solution for testing a depth learning chip.

In the solution, testing is performed on a plurality of logic units in a depth learning chip to be tested. Once there is one or more error units, a ratio of the number of the one or more error units to the total number of the logic units in the depth learning chip is compared with a predetermined ratio. When the ratio does not exceed the predetermined ratio, it is still considered that the depth learning chip is a qualified chip. In detail, a plurality of inference logic units in the depth learning chip may be tested. A current depth learning chip has limitations in power consumption, that is, not all the inference logic units in the current depth learning chip usually work. Therefore, even if it is tested that a certain inference logic unit is the error unit, information of the error unit needs to be stored, and the error unit is disabled when the depth learning chip is used. With the solution for testing the depth learning chip in the present disclosure, a standard for determining an unqualified chip is refined, thereby improving the availability of the chip, and reducing the cost greatly.

Embodiments of the present disclosure will be described in detail below with reference to the accompanying drawings. FIG. 1 is a block diagram illustrating an exemplary scene 100 where a plurality of embodiments of the present disclosure may be implemented. As illustrated in FIG. 1, the exemplary scene 100 includes a testing device 110, a chip 120 to be tested, and a testing result 130. The chip 120 to be tested may a depth learning chip applied to a data center, which may support a business scene based on a depth learning algorithm such as speech recognition, image processing, machine translation, search recommendation and the like. The testing device 110 may receive the chip 120 to be tested and determine the testing result 130 of the chip 120 to be tested by technologies such as automatic test machine (ATE) scanning.

In FIG. 1, the testing result 130 of the chip 120 to be tested is generated by following key actions. Firstly, the testing device 110 tests the plurality of logic units in the chip 120 to be tested. It should be noted that, the chip 120 to be tested may be a chip that is never tested or a chip that does not pass a testing of a conventional testing device. Secondly, the testing device 110 needs to further determine whether the ratio of the one or more error units to all logic units is small enough after testing the one or more error units. When the ratio is small enough, the chip 120 to be tested may still be determined as the qualified chip, thus the availability of the chip, reflected in the testing result 130, is significantly improved. A structure of the chip 120 to be tested, which includes the plurality of logic units, will be described in detail below with reference to FIG. 2.

Figure 2:
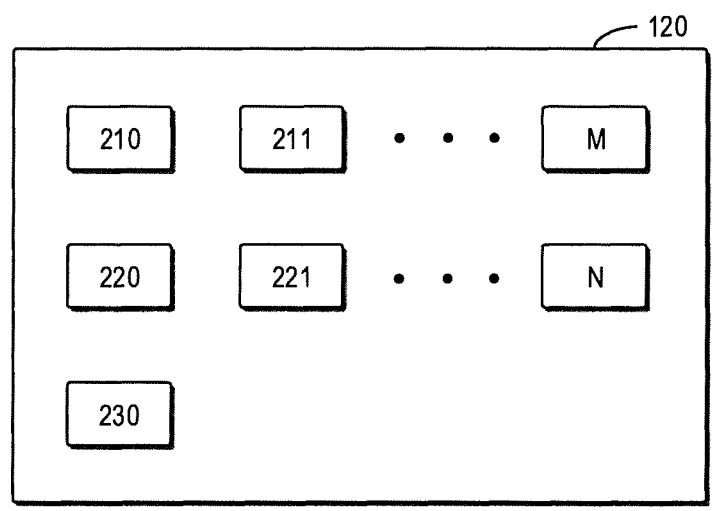
FIG. 2 is a schematic diagram illustrating a depth learning chip according to embodiments of the present disclosure.

FIG. 2 is a schematic diagram illustrating a depth learning chip 120 according to embodiments of the present disclosure. As illustrated in FIG. 2, the depth learning chip 120 includes a plurality of inference logic units 210, 211, . . . , M for executing a reference operation of depth learning, and a plurality of training logic units 220, 221, . . . , N for executing a training operation of depth learning. In addition, the depth learning chip 120 may further include a storage unit 230 such as an on-chip electrically-programmable fuse (eFUSE) for recording information of the one or more error units.

For describing clearly, FIG. 2 of the present disclosure merely illustrates the plurality of logic units and the storage unit, and does not illustrate other function units. In addition, it further should be understood that, the description for the structure and function of the depth learning chip 120 for exemplary purposes is not intended to limit the scope of the subject matter described herein. The subject matter described herein may be implemented in different structures and/or functions. As an example, in addition to the storage unit 230 and other necessary components, the depth learning chip 120 may include the plurality of inference logic units 210, 211, . . . , M for performing the inference operation of depth learning or the plurality of training logic units 220, 221, . . . , N for performing the training operation of depth learning. In order to explain the principle of the above solution more clearly, a procedure for testing the depth learning chip will be described in more detail below with reference to FIG. 3.

Figure 3:
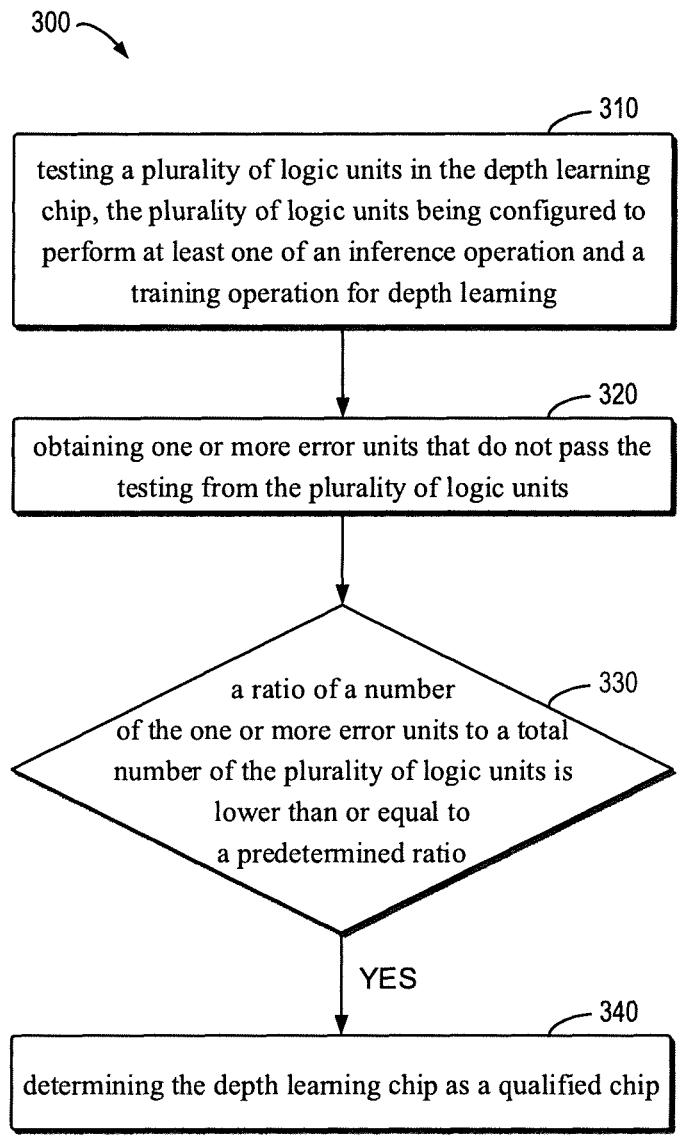
FIG. 3 is a flow chart illustrating a procedure for testing a depth learning chip according to embodiments of the present disclosure.

FIG. 3 is a flow chart illustrating a procedure 300 for testing a depth learning chip according to embodiments of the present disclosure. The procedure 300 may be implemented by the testing device 110 illustrated in FIG. 1. For discussing easily, the procedure 300 will be described in conjunction with FIG. 1 and FIG. 2.

At block 310, the testing device 110 tests a plurality of logic units in the depth learning chip as the chip 120 to be tested. As an example, the chip 120 to be tested may be an inference chip for depth learning, and the plurality of logic units are configured to perform an inference operation for depth learning. In addition, the chip 120 to be tested may be a training chip for depth learning, and the plurality of logic units are configured to perform a training operation for depth learning. In addition, the chip 120 to be tested may be an inference and training chip for performing at least one of the inference operation and the training operation. As illustrated in FIG. 2, the testing device 110 tests the plurality of inference logic units 210, 211, . . . , M in the chip 120 to be tested for performing the inference operation of the depth learning, and the plurality of training logic units 220, 221, . . . , N in the chip 120 to be tested for performing the training operation of the depth learning.

At block 320, the testing device 110 obtains one or more error units that do not pass the testing from the plurality of logic units. As an example, any inference logic unit 210, 211, . . . , M, or any training logic unit 220, 221, . . . , N in FIG. 2 may be tested as the error unit. The testing device 110 may count the number of one or more error units. In this way, the testing device 110 tests each logic unit in the chip 120 to be tested, thereby refining the testing procedure and facilitating to obtain a more accurate testing result subsequently.

At block 330, the testing device 110 compares a ratio of a number of the one or more error units to a total number of the plurality of logic units in the chip 120 to be tested with a predetermined ratio. As an example, the predetermined ratio may be 5%, 10%, 15%, or other ratio, and the predetermined ratio depends on a power limitation to the chip 120 to be tested. Taking inference logic units as an example, there is the power limitation when the chip 120 to be tested is taken as the depth learning chip, and all the inference logic units in the chip 120 to be tested will not work at the same time, that is, there are almost always idle inference logic units in the chip 120 to be tested for replacing the one or more error units. Therefore, as long as the number of the one or more error units is not high enough, there may be enough idle inference logic units to replace the one or more error units. Moreover, a conventional redundant design method is not suitable for each logic unit in the depth learning chip as a manufacturing cost of the chip is greatly increased. When the ratio is lower than or equal to the predetermined ratio, the procedure is proceeded to actions at block 340 below.

At block 340, the testing device 110 determines the depth learning chip of the chip 120 to be tested as the qualified chip. Taking the inference logic units as an example, when the plurality of logic units in the chip 120 to be tested include the plurality of inference logic units for performing the inference operation, and the ratio of the number of the one or more error units to the total number of inference logic units on the chip 120 to be tested is lower than or equal to the predetermined ratio, information of the one or more error units is recorded in the storage unit 230 of the chip 120 to be tested, such that the one or more error units are disabled when the chip 120 to be tested is configured for performing the inference operation. In this way, a large part of chips that do not pass the testing of a conventional testing device may be reused, and unnecessary waste may be avoided.

In addition, taking the training logic units as an example, when the plurality of logic units in the chip 120 to be tested include the plurality of training logic units for performing the training operation, and the ratio of the number of the one or more error units to the total number of training logic units on the chip 120 to be tested is lower than or equal to the predetermined ratio, information of the one or more error units is recorded in the storage unit 230 of the chip 120 to be tested, such that the one or more error units are disabled when the chip 120 to be tested is configured for performing the training operation. In this way, the availability of the chip may also be improved, and waste for the resource may be avoided.

In some embodiments, the chip 120 to be tested may be a depth learning chip including both the inference logic units and the training logic units, that is, as illustrated in FIG. 2, the plurality of logic units may include the plurality of inference logic units 210, 211, . . . , M for performing the inference operation of depth learning and the plurality of training logic units 220, 221, . . . , N for performing the training operation of depth learning. At this time, when there is one or more error units in the plurality of inference logic units 210, 211, . . . , M, the chip 120 to be tested is configured to merely perform the training operation of depth learning, and when there is one or more error units in the plurality of training logic units 220, 221, . . . , M, the chip 120 to be tested is configured to merely perform the reference operation of depth learning. Alternatively or additionally, when there is no error unit in the plurality of training logic units 220, 221, . . . N, the chip 120 to be tested is configured to perform at least one of the inference operation and the training operation for depth learning. In this way, some functions of the depth learning chip may be selectively discarded, but other parts of the depth learning chip are still available.

In some embodiments, when the ratio of the number of the one or more error units to the total number of the plurality of logic units is greater than the predetermined ratio, the testing device 110 determines the depth learning chip of the chip 120 to be tested as a fault chip.

In the present disclosure, the storage unit is an on-chip electrically-programmable fuse, and the plurality of inference logic units include at least one of: an artificial intelligence co-processing unit SDCDNN; and an artificial intelligence processor XPU™ (a FPGA intelligent cloud Accelerator released by Baidu™).

According to one or more embodiments of the present disclosure, the testing result 130 may be obtained. Since a feature that the depth learning chip includes a plurality of same or repeated logic units is utilized, the testing device 110 tolerates a situation that there is a small number of error units in the chip 120 to be tested, such that the availability of the chip, in the testing result 130, is significantly higher than that of the conventional testing device.

Compared with the conventional technology, the significance of the solution of the present disclosure lies in that each logic unit in the depth learning chip is tested by refining the chip testing operation. On the premise that a chip area is not increased and a normal working performance of the chip is not affected, other logic units except the SRAM (static random access memory) in the depth learning chip, which account for 70% of the chip area, may have a possibility for producing the one or more errors. Moreover, most of chips with the one or more error units may be utilized, thereby significantly improving the availability of the depth learning chip, reducing the chip cost and further increasing a market competitiveness of the chip.

The testing solution for the depth learning chip in combination with the inference logic units and the training logic units in some example scenes is discussed above. However, it should be understood that, the description for these scenes is only to explain embodiments of the present disclosure by means of the example. Depending on an actual requirement, different testing objects may be selected under different or similar scenes. The technical solution of the present disclosure may also have various advantages above when applied to test other repeating units in the depth learning chip.

Figure 4:
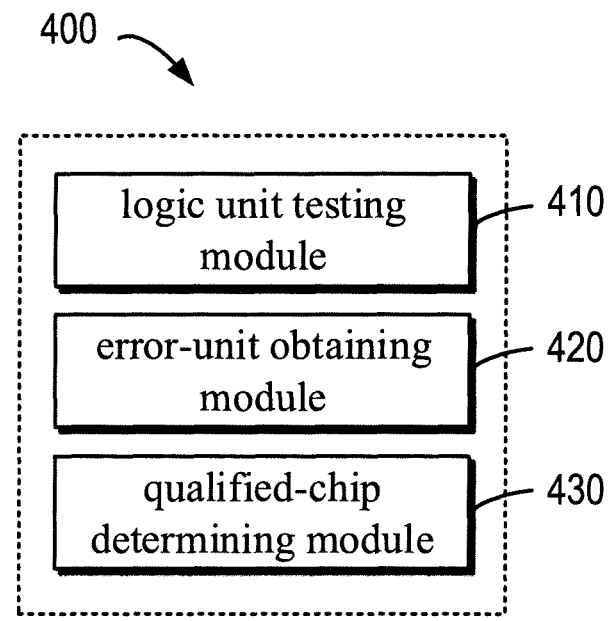
FIG. 4 is a block diagram illustrating an apparatus for testing a depth learning chip according to embodiments of the present disclosure.

FIG. 4 is a block diagram illustrating an apparatus 400 for testing a depth learning chip according to embodiments of the present disclosure. The apparatus 400 may be included in or implemented as the testing device 110 illustrated in FIG. 1. As illustrated in FIG. 4, the apparatus 400 may include a logic unit testing module 410, configured to test a plurality of logic units in the depth learning chip. The plurality of logic units are configured to perform at least one of an inference operation and a training operation for depth learning. The apparatus 400 may further include an error-unit obtaining module 420, configured to obtain one or more error units that do not pass the testing from the plurality of logic units. The apparatus 400 may further include a qualified-chip determining module 430, configured to determine the depth learning chip as a qualified chip in response to a ratio of a number of the one or more error units to a total number of the plurality of logic units being lower than or equal to a predetermined ratio.

In some embodiments, the plurality of logic units may include a plurality of inference logic units for performing the reference operation, and the qualified-chip determining module 430 may include: a first information recording module (not illustrated), configured to record information of the one or more error units in a storage unit of the depth learning chip, such that the one or more error units are disabled when the depth learning chip is configured to perform the reference operation.

In some embodiments, the plurality of logic units may include a plurality of training logic units for performing the training operation, and the qualified-chip determining module 430 may include: a second information recording module (not illustrated), configured to record information of the one or more error units in a storage unit of the depth learning chip, such that the one or more error units are disabled when the depth learning chip is configured to perform the training operation.

In some embodiments, the plurality of logic units may include a plurality of inference logic units for performing the reference operation, and a plurality of training logic units for performing the training operation. The apparatus 400 may further include: a training operation setting module (not illustrated), configured to set the depth learning chip to merely perform the training operation for the depth learning in response to that there is the one or more error units in the plurality of inference logic units. Or, the apparatus 400 may further include: a reference operation setting module (not illustrated), configured to set the depth learning chip to merely perform the reference operation for the depth learning in response to that there is the one or more error units in the plurality of training logic units.

In some embodiments, the apparatus 400 may further include: an operation setting module (not illustrated), configured to set the depth learning chip to perform the at least one of the reference operation and the training operation for the depth learning in response to that there is no error unit in the plurality of training logic units.

In some embodiments, the apparatus 400 may further include: a fault chip determining module (not illustrated), configured to determine the depth learning chip as a fault chip in response to the ratio of the number of the one or more error units to the total number of the plurality of logic units being greater than the predetermined ratio.

In some embodiments, the storage unit may be an on-chip electrically-programmable fuse, and the plurality of inference logic units may include at least one of: an artificial intelligence co-processing unit SDCDNN; and an artificial intelligence processor XPU™.

According to one or more embodiments of the present disclosure, the apparatus 400 of each of the above embodiments utilizes a feature that the depth learning chip includes a plurality of same or repeated logic units, the apparatus 400 tolerates a situation that there is a small number of error units in the chip 120 to be tested, such that the availability of the chip in the testing result 130 is significantly higher than that of the conventional testing device.

Figure 5:
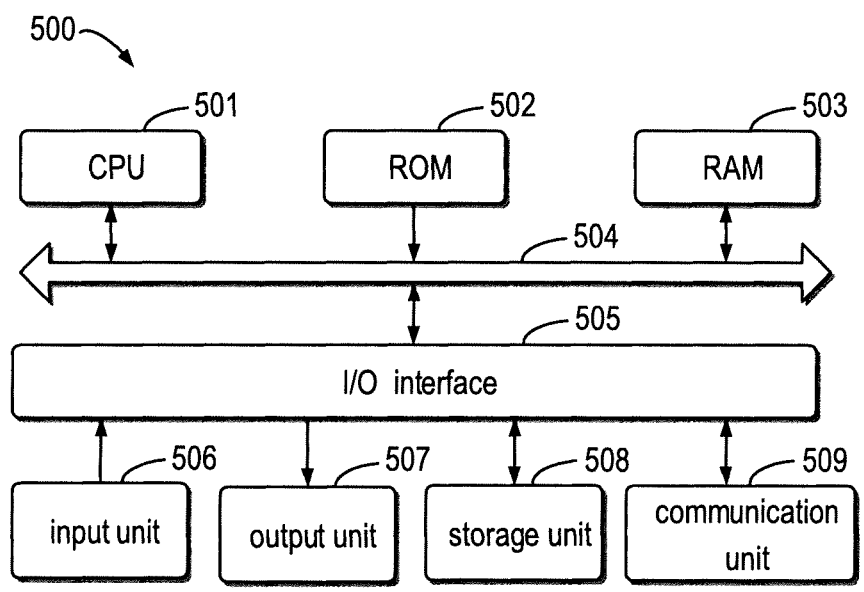
FIG. 5 is a block diagram illustrating a computing device capable of implementing a plurality of embodiments of the present disclosure.

FIG. 5 is a block diagram illustrating an exemplary device 500 capable of implementing embodiments of the present disclosure. The device 500 may be configured to implement a computing device 110 illustrated in FIG. 1. As illustrated in FIG. 5, the device 500 includes a central processing unit (CPU) 501. The CPU 501 may execute various appropriate actions and processes according to computer program instructions stored in a read only memory (ROM) 502 or computer program instructions loaded to a random access memory (RAM) 503 from a storage unit 508. The RAM 503 may also store various programs and date required by the device 500. The CPU 501, the ROM 502, and the RAM 503 may be connected to each other via a bus 504. An input/output (I/O) interface 505 is also connected to the bus 504.

A plurality of components in the device 500 are connected to the I/O interface 505, including: an input unit 506 such as a keyboard, a mouse; an output unit 507 such as various types of displays, loudspeakers; a storage unit 508 such as a magnetic disk, an optical disk; and a communication unit 509, such as a network card, a modem, a wireless communication transceiver. The communication unit 509 allows the device 500 to exchange information/data with other devices over a computer network such as the Internet and/or various telecommunication networks.

The CPU 501 executes the above-mentioned methods and processes, such as the procedure 300. For example, in some embodiments, the procedure 300 may be implemented as computer software programs. The computer software programs are tangibly contained a machine readable medium, such as the storage unit 508. In some embodiments, a part or all of the computer programs may be loaded and/or installed on the device 500 through the ROM 502 and/or the communication unit 509. When the computer programs are loaded to the RAM 503 and are executed by the CPU 501, one or more blocks of the procedure 300 described above may be executed. Alternatively, in other embodiments, the CPU 501 may be configured to execute the procedure 300 in other appropriate ways (such as, by means of hardware).

The functions described herein may be executed at least partially by one or more hardware logic components. For example, without not limitation, exemplary types of hardware logic components that may be used include: a field programmable gate array (FPGA), an application specific integrated circuit (ASIC), an application specific standard product (ASSP), a system on chip (SOC), a complex programmable logic device (CPLD) and the like.

Program codes for implementing the method of the present disclosure may be written in any combination of one or more programming languages. These program codes may be provided to a processor or a controller of a general purpose computer, a special purpose computer or other programmable data processing device, such that the functions/operations specified in the flowcharts and/or the block diagrams are implemented when these program codes are executed by the processor or the controller. These program codes may execute entirely on a machine, partly on a machine, partially on the machine as a stand-alone software package and partially on a remote machine or entirely on a remote machine or entirely on a server.

In the context of the present disclosure, the machine-readable medium may be a tangible medium that may contain or store a program to be used by or in connection with an instruction execution system, apparatus, or device. The machine-readable medium may be a machine-readable signal medium or a machine-readable storage medium. The machine-readable medium may include, but not limit to, an electronic, magnetic, optical, electromagnetic, infrared, or semiconductor system, apparatus, or device, or any suitable combination of the foregoing. More specific examples of the machine-readable storage medium may include electrical connections based on one or more wires, a portable computer disk, a hard disk, a RAM, a ROM, an erasable programmable read-only memory (EPROM or flash memory), an optical fiber, a portable compact disk read-only memory (CD-ROM), an optical storage, a magnetic storage device, or any suitable combination of the foregoing.

In addition, although the operations are depicted in a particular order, it should be understood to require that such operations are executed in the particular order illustrated in the accompanying drawings or in a sequential order, or that all illustrated operations should be executed to achieve the desired result. Multitasking and parallel processing may be advantageous in certain circumstances. Likewise, although several specific implementation details are included in the above discussion, these should not be construed as limitation of the scope of the present disclosure. Certain features described in the context of separate embodiments may also be implemented in combination in a single implementation. On the contrary, various features described in the context of the single implementation may also be implemented in a plurality of implementations, either individually or in any suitable sub-combination.

Although the subject matter has been described in language specific to structural features and/or methodological acts, it should be understood that the subject matter defined in the appended claims is not limited to the specific features or acts described above. Instead, the specific features and acts described above are merely exemplary forms of implementing the claims.

What is claimed is:

1. A method for testing a depth learning chip, comprising:
   testing a plurality of logic units in the depth learning chip, the plurality of logic units being configured to perform at least one of an inference operation and a training operation for depth learning;

obtaining one or more error units that do not pass the testing from the plurality of logic units; and in response to a ratio of a number of the one or more error units to a total number of the plurality of logic units being lower than or equal to a predetermined ratio, determining the depth learning chip as a qualified chip, wherein the plurality of logic units comprises a plurality of inference logic units for performing reference operation, and a plurality of training logic units for performing the training operation, and the method further comprises:

in response to that there is the one or more error units in the plurality of inference logic units, setting the depth learning chip to merely perform the training operation for the depth learning; or in response to that there is the one or more error units in the plurality of training logic units, setting the depth learning chip to merely perform the reference operation for the depth learning.

2. The method of claim 1, wherein the plurality of logic units comprises a plurality of inference logic units for performing the reference operation, and determining the depth learning chip as the qualified chip comprises:

recording information of the one or more error units in a storage unit of the depth learning chip, such that the one or more error units are disabled when the depth learning chip is configured to perform the reference operation.

3. The method of claim 1, wherein the plurality of logic units comprises a plurality of training logic units for performing the training operation, and determining the depth learning chip as the qualified chip comprises:

recording information of the one or more error units in a storage unit of the depth learning chip, such that the one or more error units are disabled when the depth learning chip is configured to perform the training operation.

4. The method of claim 1, further comprising:

in response to that there is no error unit in the plurality of training logic units, setting the depth learning chip to perform the at least one of the reference operation and the training operation for the depth learning.

5. The method of claim 1, further comprising:

in response to the ratio of the number of the one or more error units to the total number of the plurality of logic units being greater than the predetermined ratio, determining the depth learning chip as a fault chip.

6. The method of claim 2, wherein the storage unit is an on-chip electrically-programmable fuse.

7. An electronic device, comprising:

one or more processors; and a storage device, configured to store one or more programs, wherein when the one or more programs are executed by the one or more processors, the one or more processors are caused to implement a method for testing a depth learning chip, the method comprising:

testing a plurality of logic units in the depth learning chip, the plurality of logic units being configured to perform at least one of an inference operation and a training operation for depth learning;

obtaining one or more error units that do not pass the testing from the plurality of logic units; and in response to a ratio of a number of the one or more error units to a total number of the plurality of logic units being lower than or equal to a predetermined ratio, determining the depth learning chip as a qualified chip, wherein the plurality of logic units comprises a plurality of inference logic units for performing reference operation, and a plurality of training logic units for performing the training operation, and the method further comprises:

in response to that there is the one or more error units in the plurality of inference logic units, setting the depth learning chip to merely perform the training operation for the depth learning; or in response to that there is the one or more error units in the plurality of training logic units, setting the depth learning chip to merely perform the reference operation for the depth learning.

8. The device of claim 7, wherein the plurality of logic units comprises a plurality of inference logic units for performing the reference operation, and determining the depth learning chip as the qualified chip comprises:

recording information of the one or more error units in a storage unit of the depth learning chip, such that the one or more error units are disabled when the depth learning chip is configured to perform the reference operation.

9. The device of claim 7, wherein the plurality of logic units comprises a plurality of training logic units for performing the training operation, and determining the depth learning chip as the qualified chip comprises:

recording information of the one or more error units in a storage unit of the depth learning chip, such that the one or more error units are disabled when the depth learning chip is configured to perform the training operation.

10. The device of claim 7, wherein the method further comprises:

in response to that there is no error unit in the plurality of training logic units, setting the depth learning chip to perform the at least one of the reference operation and the training operation for the depth learning.

11. The device of claim 7, wherein the method further comprises:

in response to the ratio of the number of the one or more error units to the total number of the plurality of logic units being greater than the predetermined ratio, determining the depth learning chip as a fault chip.

12. The device of claim 8, wherein the storage unit is an on-chip electrically-programmable fuse.

13. A non-transient computer-readable storage medium having a computer program stored thereon, wherein a method for testing a depth learning chip is implemented when the computer program is executed by a processor, the method comprising:

testing a plurality of logic units in the depth learning chip, the plurality of logic units being configured to perform at least one of an inference operation and a training operation for depth learning;

obtaining one or more error units that do not pass the testing from the plurality of logic units; and in response to a ratio of a number of the one or more error units to a total number of the plurality of logic units being lower than or equal to a predetermined ratio, determining the depth learning chip as a qualified chip, wherein the plurality of logic units comprises a plurality of inference logic units for performing reference operation, and a plurality of training logic units for performing the training operation, and the method further comprises:

in response to that there is the one or more error units in the plurality of inference logic units, setting the depth learning chip to merely perform the training operation for the depth learning; or in response to that there is the one or more error units in the plurality of training logic units, setting the depth learning chip to merely perform the reference operation for the depth learning.

14. The non-transient computer-readable storage medium of claim 13,
wherein the plurality of logic units comprises a plurality of inference logic units for performing the reference operation, and determining the depth learning chip as the qualified chip comprises:
recording information of the one or more error units in a storage unit of the depth learning chip, such that the one or more error units are disabled when the depth learning chip is configured to perform the reference operation.

15. The non-transient computer-readable storage medium of claim 13, wherein the plurality of logic units comprises a plurality of training logic units for performing the training operation, and determining the depth learning chip as the qualified chip comprises:
recording information of the one or more error units in a storage unit of the depth learning chip, such that the one or more error units are disabled when the depth learning chip is configured to perform the training operation.

16. The non-transient computer-readable storage medium of claim 13, wherein the method further comprises:
in response to that there is no error unit in the plurality of training logic units, setting the depth learning chip to perform the at least one of the reference operation and the training operation for the depth learning.

17. The non-transient computer-readable storage medium of claim 13, wherein the method further comprises:
in response to the ratio of the number of the one or more error units to the total number of the plurality of logic units being greater than the predetermined ratio, determining the depth learning chip as a fault chip.

\* \* \* \* \*